United States Patent [19]

Walles et al.

[11] Patent Number: 4,842,800
[45] Date of Patent: Jun. 27, 1989

[54] METHOD OF ENCAPSULATING ELECTRONIC DEVICES

[75] Inventors: Erik W. Walles, Rensselaer; James V. Crivello, Clifton Park; John H. Lupinski, Scotia, all of N.Y.

[73] Assignee: General Electric Company, Schenectady, N.Y.

[21] Appl. No.: 103,153

[22] Filed: Oct. 1, 1987

[51] Int. Cl.$^4$ ............................................... B29C 45/14
[52] U.S. Cl. ........................... 264/272.13; 264/272.17; 264/331.12; 264/331.14
[58] Field of Search ...................... 264/272.17, 272.13, 264/331.12, 331.14, 272.11

[56] References Cited

U.S. PATENT DOCUMENTS 4,173,551 11/1979 Crivello ........................... 260/18 EP
4,358,552 11/1982 Shinohara et al. ................... 523/443
4,388,450 6/1983 Crivello ............................... 525/502

OTHER PUBLICATIONS

"Reliability of Plastic-Encapsulated Integrated Circuits in Moisture Environments", Gallace et al., *RCA Review*, vol. 45, Jun. 84, pp. 249–277.

*Primary Examiner*—James Lowe
*Attorney, Agent, or Firm*—William A. Teoli; James C. Davis, Jr.; William H. Pittman

[57] ABSTRACT

A method for encapsulating microelectronic devices is provided using a heat curable epoxy composition having a monomeric or polymeric diaryliodonium hexafluoroantimonate salt. Curable compositions are also provided as well as encapsulated microelectronic devices.

7 Claims, No Drawings

METHOD OF ENCAPSULATING ELECTRONIC DEVICES

CROSS-REFERENCE TO RELATED APPLICATIONS

Reference is made to copending applications of Crivello et al., Ser. No. 064,433, filed June 22, 1987, and Ser. No. 103,156, filed Oct. 1, 1987 and H. Chao, Ser. No. Ser. No. 103,154, filed Oct. 1, 1987, filed concurrently herewith and assigned to the same assignee as the present invention and incorporated herein by reference.

BACKGROUND OF THE INVENTION

Prior to the present invention, commercially available plastic encapsulants for electronic devices had several serious disadvantages. One disadvantage, for example, was that prior to use, the encapsulant required refrigeration, preferably to 4° C. and protection from moisture during shipment and storage. Unless the encapsulant composition was refrigerated and protected from moisture, it did not provide suitable flow length for filling multicavity molds. Encapsulant molding powders are generally sealed inside several plastic bags and surrounded by dry ice before shipment by the manufacturer. As a result, the material must be allowed several hours to reach room temperature in the absence of moisture before it is used to encapsulate an electronic device to minimize a build-up of water in the powder due to atmospheric condensation.

Although flow length during injection molding is an important consideration for qualifying commercially available curable polymeric materials for device encapsulation, another equally important requirement of the electronic system manufacturers is that after cure, the plastic encapsulated electronic device must have the ability to resist changes in humidity conditions over a wide temperature range. One way to test the resistance of plastic encapsulated electronic devices to high humidity over various temperature ranges, such as experienced in South East Asia, is by using the "HAST" test (highly accelerated stress test) as discussed by L. Gallace et al. in "Reliability of Plastic-Encapsulated Integrated Circuits and Moisture Environments", RCA Solid State Division, Somerville, N.J. 08876; and RCA Review. Vol. 45. (June 1984) pages 249–277. Another version of the HAST test is shown by K. Ogawa et al., Automatically Controlled 2-Vessel Pressure-Cooker Test—Equipment IEEE Transactions on Reliability, Vol. R-32, No. 2 (June 1983). The HAST test determines how long terminals of a plastic encapsulated device will survive while subjected to 18 volts during exposure to 85RH, 145° C. and 2.7 atmospheres of steam. The devices are periodically tested with a Gen-Rad model 1731M/linear IC tester having internal diagnostics and system calibration.

An additional consideration which must be addressed by encapsulant composition manufacturers for the electronic industry is the cure temperature required for commercially available encapsulants which are usually epoxy resin formulations. It is generally known that presently available encapsulants which are injection molded onto electronic devices require a temperature of at least 180° C. Such temperatures often create excessive stresses at the interface of the cured plastic encapsulant and the electronic device upon cooling.

In order to minimize the cracking of silicon chips resulting from 180° C. plastic encapsulation, silicone resin modified epoxy resins have been used as encapsulants, as shown by K. Kuwata et al., IEEE, 1985 (18–22).

An additional concern of the electronic systems manufacturers is that plastic encapsulated electronic devices requiring soldering often fail because the heat distortion temperature (HDT) of the cured encapsulant is often too low, i.e. between about 200° C. to 250° C. The molded encapsulant can experience a change in shape (distortion), when the device is dipped into a molten solder bath. Temperatures up to 290° C. are sometimes unavoidable in instances where solder fluxes which are often used to facilitate metal contact can not be tolerated.

It would be desirable, therefore, to provide less stressful encapsulating compositions curable at temperatures significantly below 180° C., which have HDTs after cure exceeding 300° C. Encapsulated devices fabricated from such encapsulants would have substantially reduced stress due to decreased thermal expansion. In addition, such encapsulated devices could be made with surface areas exceeding ⅛ sq.in., without cracking. It also would be desirable to have encapsulated electronic devices having greater than a 50% survival rate when subjected to HAST test conditions measuring reliability in moisture environments.

The present invention is based on our discovery that if a catalytic amount of a compatible monomeric or polymeric diaryliodonium hexafluoroantimonate salt as defined hereinafter can be utilized in combination with an effective amount of a copper compound, as defined hereinafter, as a cocatalyst, and the resulting thermal initiator is employed in combination with a substantially chloride-free epoxy resin and a fused silica filler, superior silicon chip encapsulating compositions are provided. Many of the aforementioned requirements of the electronic systems industry can be satisfied. For example, the aforementioned diaryliodonium hexafluoroantimonate catalyst and copper compound cocatalyst has been found to provide encapsulating compositions which are shelf stable indefinitely at ambient temperatures and are curable at 150° C. These encapsulants can provide sealed electronic devices having HDTs from about 250° C. to 345° C., and reduced incidence of cracking. The encapsulated devices also have been found to far exceed the 50% survival rate after a period of 80 hours under the aforedescribed HAST test conditions. In addition, the dynamic mechanical properties of the cured encapsulating composition of the present invention, in accordance with ASTM test D2236-81, show that devices encapsulated in accordance with the present invention have reduced likelihood of failure due to shape alteration during device performance as compared to commercially available devices encapsulated with plastic.

STATEMENT OF THE INVENTION

There is provided by the present invention, a method for making plastic encapsulated electronic devices capable of exceeding a 50% survival rate when subjected to a moisture-ladened environment at a temperature of about 145° C. for a period of at least 80 hours under highly accelerated stressed test conditions, which comprises encapsulating the electronic devices at a temperature of 120° to 230° C. at a pressure of 400 to 1500 psi, with a heat curable composition comprising by weight, (A) 100 parts of an epoxy resin having less than 100 ppm of hydrolyzable chloride,
(B) 10 to 1000 parts of fused silica filler,
(C) a catalytic number of a compatible monomeric or polymeric diaryliodonium hexafluoroantimonate salt, and
(D) up to an effective amount of a copper compound as a cocatalyst for (C).

Epoxy resins which can be utilized in the heat curable compositions employed in the practice of the method of the present invention are, for example, Quatrex epoxy resins, such as Quatrex 2410 manufactured by the Dow Chemical Company, Midland, Mich. Additional epoxy resins which can be used are any epoxy resins having a hydrolyzable total chloride content of less than about 100 ppm. These epoxy resins can be in the form of a flaked solid epoxy novolak resin having a $T_g$ from about 10°–25° C. Additional epoxy resins which can be used are shown, for example, in Plastic Focus, Vol. 16, No. 40 (Nov. 26, 1984) and certain substantially chloride-free epoxy resins shown by Shinohara et al., U.S. Pat. No. 4,358,552, incorporated herein by reference.

Further examples of the epoxy resins which can be used in the practice of the present invention are shown in Chemical Week (Nov. 28, 1984) pages 13–14.

The fused silica filler which can be used in the practice of the present invention is preferably made by the fusion of α crystalline quartz. A description of α crystalline quartz can be found on pages 818–825 of Vol. 20, Third Edition of Kirk Othmer Encyclopedia, which is incorporated herein by reference. Fused silica filler which can be utilized in the practice of the present invention also can be found in the Handbook of Fillers and Reinforcements for Plastics, Harry S. Katz et al., Van Nostrand Reinhold Company, New York (1978) pages 155–158, which is incorporated herein by reference. A preferred form of the fused silica filler is shown by the glass grain GP series manufactured by Harbison-Walker Refractories, North American Operations, Dresser Industries, Inc., One Gateway Center, Pittsburgh, Pa. 15222. Typical properties of the preferred fused silica which can be used in the practice of the present invention are as follows:

| | |
|---|---|
| SiO$_2$ | 99.6% |
| Al$_2$O$_3$ | 0.2 |
| Fe$_2$O$_3$ | 0.05 |
| Na$_2$O | 0.005 |
| K$_2$O | 0.006 |

Specific Gravity: 2.2
Coefficient of Linear Thermal Expansion: $0.4 \times 10^{-6}$ in/in/°F.
Crystal Species: Amorphous
Particle Size Distribution: (Sedigraph)

| | % Finer Than | | |
|---|---|---|---|
| Micron | GP11I | GP7I | GP3I |
| 70 | 99 | | |
| 60 | 98 | | |
| 50 | 95 | | |
| 40 | 90 | 99 | 99 |
| 30 | 77 | 94 | 97 |
| 20 | 58 | 77 | 91 |
| 10 | 33 | 45 | 73 |
| 6 | 15 | 28 | 57 |
| 4 | 4 | 12 | 46 |
| 2 | 1 | 5 | 29 |

| U.S. Screens (Cumulative % Retained) | |
|---|---|
| | GP11I |
| 100 Mesh | 0.1% |
| 200 Mesh | 5.0 |
| 325 Mesh | 23.0 |
| Passing 325 Mesh | 77.0 |

High purity fused silica from tetraethyl orthosilicate using NH or OH as a gelation catalyst also can be used. The dried gels can be crushed into a powder.

The diaryliodonium hexafluoroantimonate salts of the present invention are preferably compounds included within the formula, $$[RIR^1]^+[SbF_6]^-, \quad (1)$$

where R and R$^1$ are selected from the same or different C$_{(6-18)}$ monovalent aromatic hydrocarbon radicals and C$_{(6-18)}$ monovalent aromatic hydrocarbon radicals substituted with one or more radicals substantially inert under encapsulation conditions.

The diaryliodonium antimonate salts of the present invention, also include polymeric diaryliodonium salts comprising at least 0.01 mol percent of chemically combined divalent units selected from,

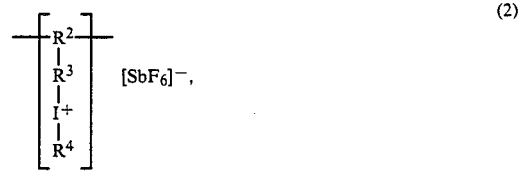
(2)

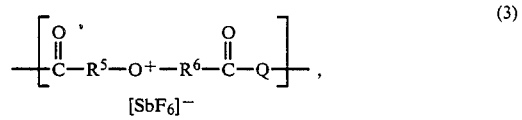
(3)

and

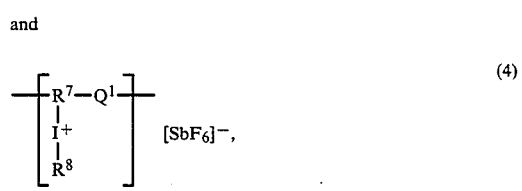
(4)

where R$^2$ is a trivalent C$_{(2-8)}$ alkylene or branched alkylene group which can be substituted with radicals inert during encapsulation, R$^3$, R$^5$ and R$^6$ are selected from C$_{(6-14)}$ divalent arylene groups which can be substituted with radicals inert during encapsulation, R$^7$ is selected from trivalent C$_{(6-14)}$ aryl groups which can be substituted with radicals inert during encapsulation, R$^4$ and R$^8$ are C$_{(6-14)}$ monovalent aryl groups which can be substituted with radicals inert during encapsulation, Q is an ester or amide linkage and Q$^1$ is methylene or —O—, and when Q$^1$ is methylene, R$^7$ is substituted with —OR$^8$, where R$^8$ is C$_{(1-14)}$ monovalent hydrocarbon group, or monovalent hydrocarbon group substituted with radicals inert during encapsulation.

Diaryliodonium antimonate salts which are included within formula (1) are, for example,

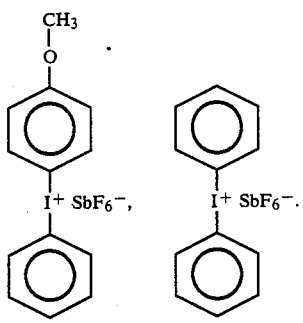

Among the polymeric diaryliodonium salts having chemically combined units of formula (2), there are included

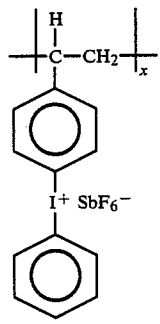

where x is an integer having a value of at least 5.

The preferred polymeric diaryliodonium salts shown by formulas (3) and (4) are, for example,

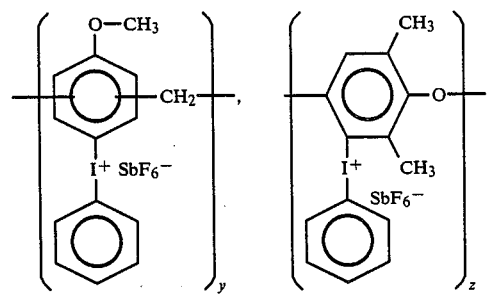

where y and z are integers having a value of at least 5.

Monovalent aromatic hydrocarbon radicals which are included within R and $R^1$ are, for example: phenyl, tolyl, xylyl, naphthyl, anthryl; substituted R and $R^1$ radicals are, for example: halogenated $C_{(6-18)}$, monovalent aromatic hydrocarbon radicals such as chlorophenyl, bromoxylyl, chloronaphthyl; $C_{(1-8)}$ alkoxy radicals such as methoxy substituted phenyl, methoxy substituted tolyl. Radicals included within $R^2$ are, for example, ethylidene, and propylidene. Radicals included within $R^4$ and $R^5$ are the same as R and $R^1$. Radicals included within $R^3$, $R^5$, and $R^6$ are divalent aromatic radicals such as phenylene, tolylene, xylylene and naphthylene. Radicals included with $R^7$ are for example,

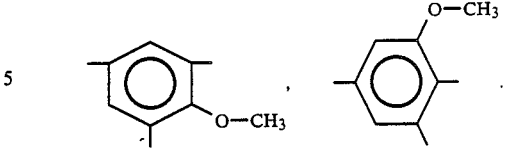

Copper compounds which can be utilized as a cocatalyst in combination with the onium salt of the present invention are preferably copper salts such as Cu(1) halides, for example Cu(1) chloride. Cu(2) salts, such as Cu(II) benzoate, Cu(II) acetate, Cu(II) stearate, Cu(II) gluconate, Cu(II) citrate. Copper chelates, such as copper acetylacetonate, are particularly preferred as a copper cocatalyst.

An effective amount of onium salt of formulas (1–4) is that amount of onium salt sufficient to provide from about 0.01 to 100 mg of antimony, per gram of epoxy resin. In instances where a copper cocatalyst is found necessary to achieve effective results, there can be used from 0.01 to 100 mg of copper, per gram of antimony, of the onium salt catalyst.

In the practice of the preferred form for making the encapsulation composition, the onium salt which hereinafter means the monomeric or polymeric onium salt of formulas (1–4) and copper cocatalyst is initially blended with the fused silica. There can be utilized during the blending of the onium salt and fused silica, an additive, such as carnauba wax at from 0.01 to 5%, based on the weight of encapsulating composition; additional additives such as antimony trioxide and carbon black also can be used. The various ingredients can be placed in a Henschel mixer to provide more intensive blending.

The resulting onium salt/fused silica mixture then can be blended with the epoxy resin. A two-roll mill can be used in accordance with standard procedures to produce the encapsulation composition.

In order that those skilled in the art will be better able to practice the invention, the following examples are given by way of illustration and not by way of limitation. All parts are by weight.

EXAMPLE 1

An onium salt catalyzed encapsulant was made using Quatrex 2410 having less than 25 ppm of chloride and 6410 having less than 150 ppm of chloride. These are manufactured by the Dow Chemical Company. In addition, there were used GP11I and GP7I, fused quartz fillers manufactured by Harbison-Walker Refractories of Pittsburgh, Pa. The fused quartz fillers had average particle sizes of less than 40 microns and less than 90 microns respectively. Copper acetylacetonate (Cu(A-cAc)$_2$) was also employed in the composition which is as follows:

| Material | Weight Percent | |
|---|---|---|
| Flammability Rating, UL | ¼" V-O | 1/16" V-O |
| Quatrex 2410 | 27.63 | 27.38 |
| GP 11I | 33.83 | 33.53 |
| GP 7I | 34.32 | 34.01 |
| [CH$_3$O—⌬—I$^+$—⌬] SbF$_6^-$ | .18 | .18 |
| Cu(AcAc)$_2$ | .13 | .12 |
| Carnauba Wax | .39 | .34 |

-continued

| Material | Weight Percent | |
|---|---|---|
| Flammability Rating, UL | ⅛" V-O | 1/16" V-O |
| Quatrex 6410 | 1.93 | 2.39 |
| Antimony Oxide Grade KR | 1.45 | 1.91 |
| Carbon Black | .14 | .14 |
| | 100.00 | 100.00 |

The above onium salt catalyzed encapsulant was prepared by mixing two kilograms of the above ingredients excluding the Quatrex 2410 and Quatrex 6410 in a Henschel mixer for three minutes at 1800 rpm and then for three minutes at 3600 rpm. A portion of this master batch and the two epoxy resins were shaken in a plastic bag to provide approximately 500 grams of a preblend for two-roll milling.

The two-roll mill was cleaned with a mixture of Quatrex 2410 and GP11I prior to milling the preblend with the front roller at 195° F. and 23 fpm and with the rear roller at 185° F. and 30 fpm. The molten preblend mixture was removed from the rear roller, rolled over the doctur blade and folded several times. It was returned to the mill a total of six times in five minutes. After cooling to room temperature, the milled material was ground through a 1/16" diameter screen. The moldability characteristics of the resulting "onium salt encapsulant" was then compared to a commercially available encapsulating composition MP-101S of the Nitto Company of Osaka, Japan, as shown by the following:

| | | Onium Salt Encapsulant | MP-101S |
|---|---|---|---|
| Spiral Flow, inches @1000 psi* | | | |
| @150° C.: | | 31 | No Cure |
| @180° C.: | | 23 | 30 |
| Hot Plate Cure Time, seconds | | | |
| @150° C.: | | 29 | No Cure |
| @180° C.: | | 11 | 22 |
| Shore D Hot Hardness, | | | |
| @150° C. | 2 min | 80 | No Cure |
| | 90 sec | 78 | No Cure |
| | 60 sec | 58 | No Cure |
| | 30 sec | Cured Spiral | No Cure |
| @180° C. | 2 min | 85 | 85 |
| | 90 sec | 85 | 80 |
| | 60 sec | 75 | 40 |
| | 30 sec | 65 | 0 |
| Release Characteristics | | Excellent | Excellent |
| Lube Bloom | | Minimal | Minimal |
| Bleed | | None | None |
| Flash | | None | None |
| Flammability Rating: | | UL ⅛" V-O | UL ⅛" V-O |

*ASTM method D3123; 0.12 to 0.14 inch cull thickness

The above results show that spiral flow occurs at 150° C. with the composition of the present invention, whereas the Nitto composition requires a cure temperature of 180° C.

Approximately 100 devices (Motorola LM-301 Operational Amplifiers) were encapsulated with the above onium salt resin and MP-101S. MP-101S was molded at 175° C. and 1000 psi for 75 seconds, whereas the onium salt resin was molded at 150° C. for 75 seconds. The transfer pressure was 800 psi and the transfer time was 12 seconds. The commercially available material was post-baked for 4 hours at 175° C., while the onium salt resin was post-baked for 16 hours at 150° C. The various encapsulated devices were tested in a linear IC tester to select samples of 10 units each for accelerated life testing in a pressure vessel at 131° C., 85% relative humidity (RH) and 2.1 atm of steam. Each device had a bias of 30 volts applied. Periodically, the samples were taken from the pressure vessel and after cooling to room temperature, they were screened with the IC tester. A series of two trials of 10 devices each were performed in the pressure vessel to determine the failure pattern at 130° C./85% RH/2.1 atm/30 V. The following results were obtained, where the numbers under Trial I and Trail II indicate the number of devices which failed out of the initial 10 devices used within the time shown. MP-101S is the commercially available encapsulant and onium salt is the composition of the present invention:

| | MP-101S | | Onium Salt | |
|---|---|---|---|---|
| Time (hrs) | Trial I | Trial II | Trial I | Trial II |
| 50 | 0 | 0 | 0 | 1 |
| 95 | — | 6 | 0 | 0 |
| 135 | — | 3 | 0 | 0 |
| 144 | 9 | — | 1 | 0 |
| 195 | 0 | 1 | 0 | 0 |
| 305 | 0 | — | 0 | 1 |
| 430 | 1 | — | 0 | 0 |
| 470 | | | 1 | 0 |
| 607 | | | 1 | 0 |
| 649 | | | 1 | 1 |
| 961 | | | 0 | 2 |
| 1013 | | | 1 | 0 |
| 1132 | | | 1 | 0 |
| 1265 | | | 1 | 0 |

The above results show that after 144 hours, 90% of the devices encapsulated with MP-101S failed, whereas only 10% of the onium salt encapsulated devices made in accordance with the practice of the present invention failed. It was found that 1013 hours were required to obtain a 50% failure rate with the devices encapsulated with the onium salt composition of the present invention.

EXAMPLE 2

Additional devices having a single $SiO_2$ passivation layer where encapsulated at 180° C. with the commercial encapsulant MP-101S, and with the onium salt encapsulating composition of Example 1. It was found upon accelerated life-testing in accordance with the procedure of Example 1, that the devices encapsulated with the commercially available resin reached a 50% failure rate at 100 hours while the devices encapsulated with the onium salt resin of Example 1 experienced a 50% failure rate after 1,500 hours. Additional encapsulated commercial devices from National Semiconductor with dual passivating layers of $SiO_2$ and $Si_3N_4$ showed a failure rate of 50% after approximately 500 hours. These results demonstrate that the onium salt encapsulating compositions of the present invention provide superior resistance to moisture and heat under accelerated life-testing conditions even in instances where the devices are protected by only a single passivating layer of silicon dioxide.

EXAMPLE 3

The procedure of Example 1 was repeated except that bis(p-t-butylphenyl)iodonium hexafluoroantimonate was used as the curing catalyst in place of the methoxyphenylphenyl iodonium hexafluoroantimonate of Example 1. Devices were encapsulated in accordance with the procedure of Example 1 and were tested at 131° C./85% RH/2.1 atm and 30 voltage bias. It was found that devices encapsulated with bis(p-t-butylphenyl)iodonium salt encapsulant provided encapsulated devices having a failure rate of only 20% after 620 hours of accelerated life testing.

EXAMPLE 4

Test bars were molded from the onium salt composition and commercially available encapsulating composition MP-101S of example 1. After a post-cure for 16 hours at 150° C. and 180° C., it was found that the average deflection temperature (HDT) of the onium salt composition was 310° and 315° C. while the average HDT of the MP-101S test bars was 241° C. These results show that devices encapsulated with the onium salt composition of the present invention can be readily soldered at temperatures of up to 290° C., and therefore do not require any fluxes which might tend to introduce contamination into the encapsulated devices.

EXAMPLE 5

The melt flow characteristics of the onium salt compositions of the present invention were compared to commercially available encapsulants after extended shelf periods at 25° C. and 43° C. under sealed conditions.

It was found that commercially available encapsulating compositions were unsuitable as encapsulants after a shelf period of about 3 days at 43° C. An initial spiral flow of 33" under melt conditions dropped to about 18" after 3 days of storage. It was found that the onium salt composition of Example 1 exhibited an initial melt flow length of about 25" which fell to an acceptable melt flow length of about 18" after about 50 days at 43° C. under sealed conditions.

A melt flow comparison after a 25° C. shelf period showed no change in melt flow length of the onium salt encapsulant after a period of over 100 days. The commercially available encapsulant had an initial melt flow length of about 33", which fell to an unacceptable flow length of less than 18" after about 90 days of storage under sealed conditions at 25° C. These results indicate that the onium salt compositions of the present invention do not require refrigeration for an extended shelf period, while the commercial encapsulant composition must be refrigerated, particularly for use beyond one week under tropical conditions.

EXAMPLE 6

A series of encapsulating compositions utilizing onium salts in accordance with the practice of the present invention were molded at 150° C. and 1000 psi for 90 seconds and post-baked for 16 hours at 150° C. There were utilized from 0.05 part to 0.3 part of onium salts per 100 parts of encapsulation composition prepared in accordance with Example 1. A comparison was made between diphenyl iodonium hexafluoroantimonate, diphenyl iodonium hexafluoroarsenate and diphenyl iodonium hexafluorophosphate. The various samples were molded at 180° C. for three minutes at 1000 psi, using a 12-second transfer time. HDT's were run in accordance with ASTM D648 employing a 10-mil deflection at 264 psi with a bar 5"×1/2"×1/8". The flow in inches was measured in accordance with ASTM method D3123. The $T_g$ was measured in accordance with ASTM method D696 to determine whether the molded samples achieved the 150° C. minimum for thermal cycling determination. Shore D hot hardness was determined in accordance with ASTM method D2240 using an average of four readings on a 0.12 to 0.14" cull immediately after the completion of transfer molding. The following results were obtained:

| Catalyst (wt %) | Flow(in) | $T_g$(°C.) | HDT(°C.) | Hardness (Shore D) |
|---|---|---|---|---|
| $SbF_6^-$ | | | | |
| .05 | 43 | 87 | 124.2 | 40 |
| .1 | 25 | 138 | 332.0 | 82 |
| .2 | 17.5 | 187 | 312.3 | 92 |
| .3 | 17 | 202 | 316.6 | 96 |
| $AsF_6^-$ | | | | |
| .05 | 31 | 76 | 111.1 | 20 |
| .1 | 29 | 87 | 142.8 | 35 |
| .2 | 15½ | 120 | 197.4 | 72 |
| .3 | 14 | 142 | 260.4 | 83 |
| $PF_6^-$ | | | | |
| .05 | no cure | | | cull not cured |
| .1 | 90 | 80 | 104.1 | cull not cured |
| .2 | 33 | 120 | 212.2 | 25 |
| .4 | 14 | 170 | 308.7 | 56 |
| .6 | 11.5 | 185 | 313.9 | 74 |

The above results show that the diphenyl iodonium hexafluoroantimonate salt provided a satisfactory flow length of about 18" with a $T_g$ exceeding 150° C. along with an HDT exceeding 300° C. and a Shore D hardness exceeding 60 when utilized in a range of about 0.1 part to about 0.3 part. The diphenyl iodonium hexafluoroantimonate encapsulant properties were sufficient to satisfy thermocycling requirements, and provided the ready removal of encapsulated devices from the mold without breaking in view of a Shore D hardness exceeding 60. In addition, because of the superior HDT, the antimonate encapsulated devices can be dipped into solder at temperatures sufficiently high to avoid the use of contaminating fluxes. On the other hand, the hexafluoroarsenate and hexafluorophosphate encapsulants did not provide a sufficient flow in combination with a satisfactory $T_g$ or HDT as well as a high Shore D hardness.

EXAMPLE 7

A mixture of 4 grams of o-cresol novolak (HT9490 of Ciba Geigy Company), 14.2 grams (0.1 mole) of methyliodide, 13.82 grams (0.1 mole) of finely ground potassium carbonate and 100 ml of acetone was refluxed with stirring for about 12 hours. After cooling the reaction mixture, it was filtered and the filtrate was concentrated in vacuo. The residue was diluted with chloroform and then washed with water to remove the salt completely. An organic layer was separated, dried with magnesium sulfate and concentrated in vacuo to provide 4.0 grams of product. Based on method of preparation, the product was a methyl-capped orthocresol novolak. The material was found to be free of phenolic hydroxyl groups based on FT-IR spectra.

A mixture of 4.0 grams of the above methyl-capped orthocresol novolak, 50 ml of acetic acid, and 7.84 grams (0.02 mole) of phenyl iodosotosylate was stirred for 90 minutes at room temperature. A slightly exothermic reaction occurred upon mixing. After stirring for 90 minutes at room temperature, the reaction mixture was poured into 100 ml of water and then extracted wth methylene chloride. The organic layer was separated and dried over magnesium sulfate and concentrated in vacuo. Based on method of preparation, there was obtained a poly(diaryliodonium tosylate).

The above poly(diaryliodonium tosylate) was dissolved in 30 ml of methylethylketone. There was added 5 dissolved in 30 ml of methylethylketone. There was added 5 grams (0.019 mole) of sodium hexafluoroantimonate, and the mixture was stirred at room temperature for one hour. The reaction mixture was then filtered through celite and the filtrate was concentrated in vacuo. The residue was diluted with methylene chloride and the solution was filtered again and then concentrated in vacuo. There was obtained 5.6 grams of a polymeric diaryl iodonium salt consisting essentially of chemically combined units of the formula

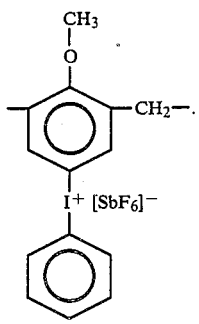

Elemental analysis of the polymer showed a 22.4% by weight of iodine and 1.44% by weight of antimony based on the weight of polymer.

A heat curable encapsulant composition was made by blending the encapsulant composition of Example 1, free of the iodonium salt and the copper salt, with 2% by weight of the above polymeric iodonium salt. The heat curable composition was found to form a hard film after 5 sec when stirred on a stainless steel hot plate at 155° C.

EXAMPLE 8

There was added 25 ml of concentrated sulfuric acid drop-wise to a cooled mixture at 0°–5° C. of 40.85 grams (0.3 mole) of o-toluic acid, 25.0 grams (0.116 mole) of potassium iodate, 120 ml of methylene chloride, and 50 ml of acetic anhydride. After the addition of the sulfuric acid was completed, the reaction mixture was allowed to stir at room temperature for several days. Then 50 ml of water was added to dissolve the potassium bisulfate formed during the reaction. The resulting methylene chloride layer was separated, and an off-white product was collected by filtration. There was obtained 19.1 grams of product which, based on method of preparation, was 4,4 $\alpha$-dimethyl-3,3'-dicarboxydiphenyliodonium bisulfate. Examination of the proton NMR spectrum confirmed the identity of the product.

A mixture of 19.1 grams of the above 4,4'-dimethyl-3,3'-dicarboxydiphenyliodonium bisulfate and 70 ml of thionylchloride was heated to reflux and hydrogen chloride gas evolution was observed. Reflux was continued for 5 hours and excess thionyl chloride was removed by distillation under reduced pressure. There was obtained a yellow solid which was dried under nitrogen and recrystallized from methylene chloride/diethyl ether to provide 13 grams of a white product. Based on method of preparation, the product was the corresponding diacid chloride of 4,4'-dimethyl-3,3'-dicarboxydiphenyl iodonium bisulfate.

There were added 0.81 g (0.0015 mole) 4,4'-dimethyl-3,3'-dichlorocarbonyldiphenyl iodonium bisulfate and 0.31 g (0.0015 mole) phthaloyl chloride in 10 ml of methylene chloride to a rapidly stirred mixture consisting of 0.41 g (0.0035 mole) cis,trans-2,5-dimethylpiperazine in 20 ml methylene chloride, 1.25 ml of 5% sodium laurylsulfate solution and 15 ml of ice water containing 0.25 g (0.0125 mole) of sodium hydroxide. The resulting mixture was allowed to stir for about 20 hours. The turbid reaction mixture was then poured into water. There was obtained 1.02 g of white waxy solid when the mixture was filtered.

The above product was dissolved in 10 ml of dioxane and to it was added 1.0 g of sodium hexafluoroantimonate in 5 ml of water. The mixture was heated to 60°–70° C. for 3 hours and then poured into water. There was obtained 0.5 g of polyamide containing iodonium hexafluoroantimonate groups. Elemental analysis showed the polyamide had 3.5% by weight of antimony.

In accordance with the procedure of Example 7, a heat curable blend was prepared having about 3% by weight of the polymeric iodonium salt. A gel was obtained after about 3 minute cure on the 155° C. hot plate.

EXAMPLE 9

The onium salt catalyzed encapsulant composition of Example 1 was evaluated for its thermal mechanical properties in accordance with ASTM D2236-81. For this dynamic mechanical test procedure, $\frac{1}{8}" \times 2.5" \times 0.5"$ test bars were molded at 180° C. and 1000 psi with a 3 minute cycle and post-baked for 16 hours at 180° C., which correspond exactly to the treatment to the encapsulated device. Similar test bars were prepared from commercially available MP101S and MP150SG encapsulants from the Nitto company for the same measurements. Forced oscillation of a cured bar was used to measure storage modulus G', loss modulus G'', and tangent delta (TD).

The 2.5" by 0.5" by $\frac{1}{8}"$ bars were heated at 2.5° C. per minute while a sinusoidal deformation (0.05 percent strain) was applied to the top of the bar in a Rheometrics Model No. RDS-7700 spectrometer. The dynamic mechanical test procedure measures the $T_g$ and stiffness of the cured-post baked sample. Stiffness is expressed by tangent delta (TD) which is shown by the following expression,

TD = (G'')/G' where G'' is loss modulus corresponding to the energy dissipated in the sample, and G' is the energy stored in the sample.

The following results were obtained where runs 1–4 show the commercially available test bars and 5–8 show onium salt test bars:

| Encapsulant | | Molding Temp. °C. | Post-[a] Cure Temp. °C. | $T_g$, °C. DMA[b] | Peak Tangent delta |
|---|---|---|---|---|---|
| MP1015 | (1) | 180 | 180 | 203 | .246 |
| | (2) | 180 | 225 | 208 | .203 |
| MP1505G | (3) | 180 | 180 | 191 | .236 |
| | (4) | 180 | 225 | 200 | .201 |
| Onium Salt | (5) | 180 | 180 | 186 | .054 |
| | (6) | 180 | 225 | 252 | .080 |
| | (7) | 150 | 150 | 188 | .118 |
| | (8) | 150 | 225 | 246 | .074 |

-continued

| Encapsulant | Molding Temp. °C. | Post-[a] Cure Temp. °C. | $T_g$, °C. DMA[b] | Peak Tangent delta |
|---|---|---|---|---|
| Steel Bar | | | | 0.00 |

[a] all samples were post-cured for 16 hours
[b] dynamic mechanical analysis with Rheometrics Post-baking of test bars 5 and 6 to 225° C. raised the $T_g$ from 186° to 252° C. This shows increased cross linking and higher resistance to shape alteration.

Although the above examples are directed to only a few of the very many variables which can be used in the practice of the present invention, it should be understood that the present invention is directed to the use of a much broader variety of monomeric and polymeric iodonium salts, epoxy resins and fused silica as well as to the compositions used thereby as shown in the description preceding these examples.

What is claimed and sought to be protected by letters patent of the United States is as follows:

1. A method for making plastic encapsulated electronic devices capable of exceeding a 50% survival rate when subjected to a moisture-ladened environment at a temperature of about 130° C. for a period of at least 100 hours under highly accelerated stressed test conditions, which comprises encapsulating the electronic devices at a temperature of 120° to 230° C. at a pressure of 400 to 1500 psi, with a heat curable composition comprising by weight,
   (A) 100 parts of an epoxy resin having less than 100 ppm of hydrolyzable chloride,
   (B) 10 to 100 parts of fused silica filler,
   (C) an amount of a compatible monomeric or polymeric onium salt catalyst as the diaryliodonium hexafluoroantimonate salt, which is sufficient to provide from about 0.01 to 100 mg. of antimony, per gram of epoxy and
   (D) up to 100 mg. of copper as a compound cocatalyst for (C), per gram of antimony.

2. A method in accordance with claim 1, where there is utilized a monomeric diaryl iodonium hexafluoroantimonate salt.

3. A method in accordance with claim 1, where there is utilized a polymeric diaryl hexafluoroantimonate iodonium salt.

4. A method in accordance with claim 1, where there is used a copper chelate as the cocatalyst for the diaryliodonium hexafluoroantimonate salt.

5. A method in accordance with claim 1, where (methoxyphenyl)phenyl iodonium hexafluoroantimonate is used as the catalyst.

6. A method in accordance with claim 1, where copper acetylacetonate is used as the cocatalyst.

7. A method in accordance with claim 1, wherein a polymeric iodonium hexafluoroantimonate novolak resin is used as the catalyst.

* * * * *